(12) United States Patent
Hirotsuru et al.

(10) Patent No.: US 11,094,648 B2
(45) Date of Patent: Aug. 17, 2021

(54) POWER MODULE

(71) Applicant: DENKA COMPANY LIMITED, Tokyo (JP)

(72) Inventors: Hideki Hirotsuru, Ichihara (JP); Yoshitaka Taniguchi, Omuta (JP); Kohki Ichikawa, Machida (JP); Atsushi Sakai, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 10 days.

(21) Appl. No.: 16/636,184

(22) PCT Filed: Jul. 30, 2018

(86) PCT No.: PCT/JP2018/028425
§ 371 (c)(1),
(2) Date: Feb. 3, 2020

(87) PCT Pub. No.: WO2019/026836
PCT Pub. Date: Feb. 7, 2019

(65) Prior Publication Data
US 2020/0373251 A1     Nov. 26, 2020

(30) Foreign Application Priority Data

Aug. 4, 2017    (JP) .............................. JP2017-151884

(51) Int. Cl.
*H01L 23/00*     (2006.01)
*H01L 23/15*     (2006.01)
*H01L 25/07*     (2006.01)

(52) U.S. Cl.
CPC ............ *H01L 23/562* (2013.01); *H01L 23/15* (2013.01); *H01L 25/072* (2013.01)

(58) Field of Classification Search
None
See application file for complete search history.

(56) References Cited

U.S. PATENT DOCUMENTS 9,929,066 B1    3/2018   Spann
2010/0078463 A1   4/2010   Speckels et al.
(Continued)

FOREIGN PATENT DOCUMENTS

DE       4338107 C1    3/1995
DE    196 09 929 A1   9/1997
(Continued)

OTHER PUBLICATIONS

Hüning et al., "Battle of the Giants—Silicon carbide versus gallium nitride," Electronik—Journal, 2010, pp. 18-20.
(Continued)

*Primary Examiner* — Angel Roman
(74) *Attorney, Agent, or Firm* — Oliff PLC

(57) ABSTRACT

A power module includes a base plate, a ceramic insulating substrate bonded on the base plate, and a semiconductor element bonded on the ceramic insulating substrate, wherein a surface of the base plate on a side opposite to the ceramic insulating substrate has a warp with a convex shape, and a linear thermal expansion coefficient $\alpha 1$ ($\times 10^{-6}$/K) of the base plate and a linear thermal expansion coefficient $\alpha 2$ ($\times 10^{-6}$/K) of the ceramic insulating substrate when a temperature decreases in the range of 25° C. to 150° C. satisfy the following Expression (1).

$$\frac{|\alpha 1 - \alpha 2|}{(\alpha 1 + \alpha 2)/2} \times 100 \leq 10 \qquad (1)$$

8 Claims, 3 Drawing Sheets

(56) References Cited

U.S. PATENT DOCUMENTS

2013/0193591 A1    8/2013  Groening et al.
2018/0261520 A1*   9/2018  Yamamoto .............. H01L 25/50
2019/0371688 A1*  12/2019  Saito ..................... H01L 25/072

FOREIGN PATENT DOCUMENTS

| DE | 10 2012 215 052 A1 | 3/2013 |
|----|----|----|
| EP | 2 725 609 A1 | 4/2014 |
| JP | H05-507030 A | 10/1993 |
| JP | H10-084077 A | 3/1998 |
| JP | H11-330308 A | 11/1999 |
| JP | 2012-138541 A | 7/2012 |
| JP | 2015-170825 A | 9/2015 |
| JP | 2016-111171 A | 6/2016 |
| WO | 91/017011 A1 | 11/1991 |

OTHER PUBLICATIONS

Jul. 2, 2020 Extended Search Report issued in European Patent Application No. 18840765.4.
Sep. 18, 2018 International Search Report issued in International Patent Application No. PCT/JP2018/028425.
Feb. 4, 2020 International Preliminary Report on Patentability issued in International Patent Application No. PCT/JP2018/028425.

\* cited by examiner (a)

(b)

POWER MODULE

TECHNICAL FIELD

The present invention relates to a power module including a semiconductor element such as an IGBT (Insulated Gate Bipolar Transistor).

BACKGROUND ART

For an inverter that controls a high-output motor such as a motor for trains, power generation, and electric vehicles/hybrid vehicles, a power module such as an IGBT module is used. A power module that has been widely used has a structure in which a semiconductor element of Si or the like, a ceramic insulating substrate of AlN, $Al_2O_3$, $Si_3N_4$, or the like, a Cu, Al or Al—SiC base plate with excellent thermal conductivity, or the like are soldered, wires, electrodes, and a resin case are attached, and then the inside is filled with silicone gel or the like (Patent Literature 1).

In general, the power module is screwed to a heat radiation component such as a heat sink through a heat radiation grease or the like before use. In the power module intended for the use with high output, the semiconductor element generates heat in large quantity and it is important to radiate the heat efficiently. If the heat radiation is not enough, the temperature of the semiconductor element may exceed the allowable temperature and this may result in malfunction or the like. In particular, the heat resistance of the entire power module is largely occupied by the heat resistance of the heat radiation grease part, and it is important to reduce the heat resistance in this part.

A ceramic insulating substrate is a component whose linear thermal expansion coefficient is relatively low because of an influence of a ceramic material. If the ceramic insulating substrate is soldered to a metal base plate of Cu or the like whose linear thermal expansion coefficient is relatively high, the shape of the heat radiation surface of the base plate becomes warped with a concave shape, or a depression may be formed on the heat radiation surface. In view of this, as the base plate for such a purpose, a complex formed of aluminum or an aluminum alloy and silicon carbide whose thermal conductivity is high and linear thermal expansion coefficient is close to that of the ceramic insulating substrate to be bonded thereto has been used (Patent Literature 2).

In the case of using a flat base plate for the above purpose, since the base plate and the ceramic insulating substrate are different in thermal expansion coefficient, stress is generated at the bonding of the both or at the subsequent time of packaging by resin sealing or the like. Because of such stress, a surface of the base plate on the side where the base plate is in close contact with the heat radiation component or the like is warped with the concave shape and when the heat radiation fin is fixed to the base plate, the sufficient adhesion is not obtained. As a solution to this problem, a technique of warping the plate surface of the base plate to be bonded to the heat radiation fin or the like into a convex shape in advance has been known (Patent Literature 3).

CITATION LIST

Patent Literature

Patent Literature 1: Japanese Unexamined Patent Publication No. H10-84077
Patent Literature 2: Japanese Unexamined Patent Publication No. H3-509860
Patent Literature 3: Japanese Unexamined Patent Publication No. H11-330308

SUMMARY OF INVENTION

Technical Problem

The structure of the ceramic insulating substrate is selected in accordance with the intended purpose, output, or withstanding voltage of the power module, and as a result, the linear thermal expansion coefficient of the ceramic insulating substrate varies depending on the structure of the substrate. In addition, a difference in the kinds of solder used in the bonding in the process of packaging causes a difference in the shapes of the heat radiation surfaces of the power modules. In this case, the warpage or the flatness of the surface on the side to be brought into close contact with the intended heat radiation component such as a heat radiation fin is not suitable and a space, or a so-called air gap, is generated when the heat radiation component such as a heat radiation fin is attached, leading to a problem of a deterioration in heat radiation property.

An object of the present invention, which has been made in view of the above problem, is to provide a power module with a heat radiation surface that can be brought into close contact with a heat radiation component suitably.

Solution to Problem

According to one aspect of the present invention, a power module comprises a base plate, a ceramic insulating substrate bonded on the base plate, and a semiconductor element bonded on the ceramic insulating substrate, wherein a surface of the base plate on a side opposite to the ceramic insulating substrate has a warp with a convex shape, and a linear thermal expansion coefficient α1 (×10⁻⁶/K) of the base plate and a linear thermal expansion coefficient α2 (×10⁻⁶/K) of the ceramic insulating substrate when a temperature decreases from 150° C. to 25° C. satisfy the following Expression (1).

$$\frac{|\alpha 1 - \alpha 2|}{(\alpha 1 + \alpha 2)/2} \times 100 \le 10 \qquad (1)$$

The difference between the size of the warp of the base plate bonded to the ceramic insulating substrate and the size of the warp of the base plate before being bonded to the ceramic insulating substrate may be 20 μm or less per a length of 10 cm.

The ceramic insulating substrate may comprise a ceramic base material and metal layers provided to both surfaces of the ceramic base material, the ceramic base material may be formed of MN, $Si_3N_4$, or $Al_2O_3$, the metal layers may be formed of at least one selected from the group consisting of Cu, Al, Mo, an alloy comprising Cu and Mo, and an alloy comprising Cu and W, and the linear thermal expansion coefficient α2 of the ceramic insulating substrate may be 5 to 9 ($\times 10^{-6}$/K).

The base plate may comprise a metal matrix composite comprising a metal comprising Al or Mg and at least one selected from the group consisting of SiC, $Si_3N_4$, $Al_2O_3$, $SiO_2$, and AlN, an alloy comprising Cu and Mo or Cu and W, or a multilayer metal plate formed of Cu and Mo or Cu and W, and the linear thermal expansion coefficient α1 of the base plate may be 5 to 9 ($\times 10^{-6}$/K) and the heat transfer rate of the base plate may be 150 W/mK or more.

The surface of the base plate on the side opposite to the ceramic insulating substrate may be machined or ground.

The flatness of the surface of the base plate on the side opposite to the ceramic insulating substrate when a heat radiation component is attached to the surface is preferably 30 μm or less.

The semiconductor element may be formed of any one of Si, SiC, or GaN.

The power module may be used as a driving inverter for a train or an automobile.

Advantageous Effects of Invention

The present invention can provide a power module including a heat radiation surface that can be brought into close contact with a heat radiation component suitably. Thus, the power module with the excellent heat radiation property can be also provided.

BRIEF DESCRIPTION OF DRAWINGS

FIG. 3 is a cross-sectional view illustrating a ceramic insulating substrate employed in Example, in which FIG. 3(a) is a cross-sectional view illustrating a ceramic insulating substrate with a three-layer structure (one metal layer type), and FIG. 3(b) is a cross-sectional view illustrating a ceramic insulating substrate with a five-layer structure (two metal layer type).

DESCRIPTION OF EMBODIMENTS

Embodiments of the present invention are hereinafter described in detail. However, it is apparent that the present invention is not limited to these embodiments.

Figure 1:
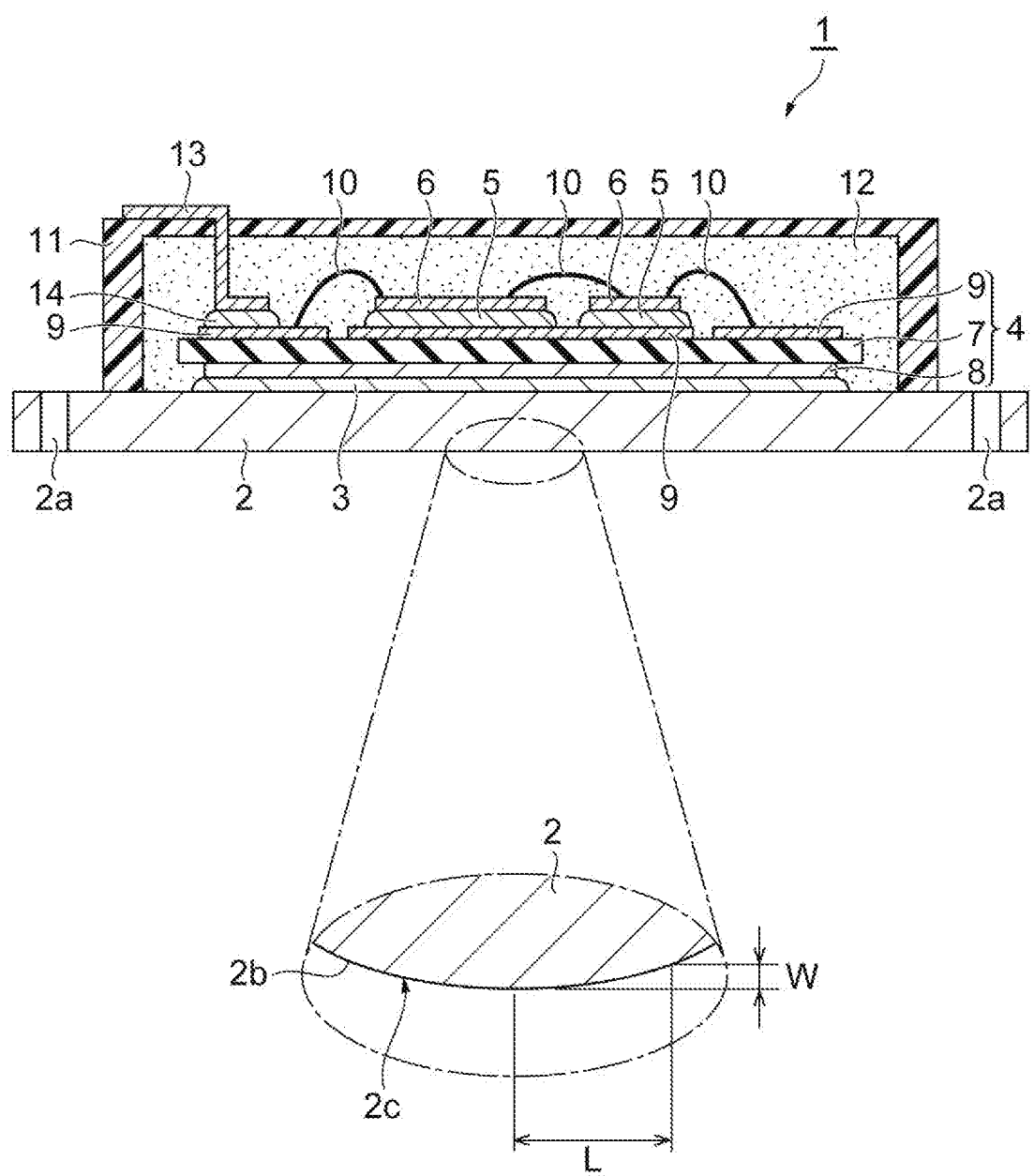
FIG. 1 is a cross-sectional view illustrating one embodiment of a power module.

FIG. 1 is a cross-sectional view illustrating one embodiment of a power module. As illustrated in FIG. 1, a power module 1 includes a base plate 2, a ceramic insulating substrate 4 bonded on the base plate 2 by a first solder 3, and a semiconductor element 6 bonded on the ceramic insulating substrate 4 by a second solder 5.

The ceramic insulating substrate 4 includes a ceramic base material 7, a first metal layer 8 provided to one surface of the ceramic base material 7, and a second metal layer 9 provided to the other surface of the ceramic base material 7. That is to say, the ceramic base material 7 has the metal layer 8 formed on one surface and the metal layer 9 formed on the other surface. At least the second metal layer 9 forms an electric circuit (metal circuit). The first metal layer 8 may or may not form an electric circuit (metal circuit). The base plate 2 is bonded to the first metal layer 8 by the first solder 3. The semiconductor element 6 is bonded to a predetermined part of the second metal layer 9 by the second solder 5, and moreover, connected to a predetermined part of the second metal layer 9 with a metal wire 10 such as an aluminum wire (aluminum line).

Each of the aforementioned constituents provided on the base plate 2 is, for example, covered with a housing 11 made of resin and having a hollow box shape with one surface open and is contained in the housing 11. The hollow part between the base plate 2 and the housing 11 is filled with a filling material 12 such as silicone gel. To a predetermined part of the second metal layer 9, an electrode 13 penetrating the housing 11 is bonded by a third solder 14 so that electric connection to the outside of the housing 11 is possible.

At an edge part of the base plate 2, attachment holes 2a for screwing used for attaching, for example, a heat radiation component to the power module 1 are formed. The number of attachment holes 2a is four or more, for example. At the edge part of the base plate 2, an attachment groove may be formed instead of the attachment holes 2a. The attachment groove is formed in such a way that a side wall of the base plate 2 has a U-like cross-sectional shape.

Figure 2:
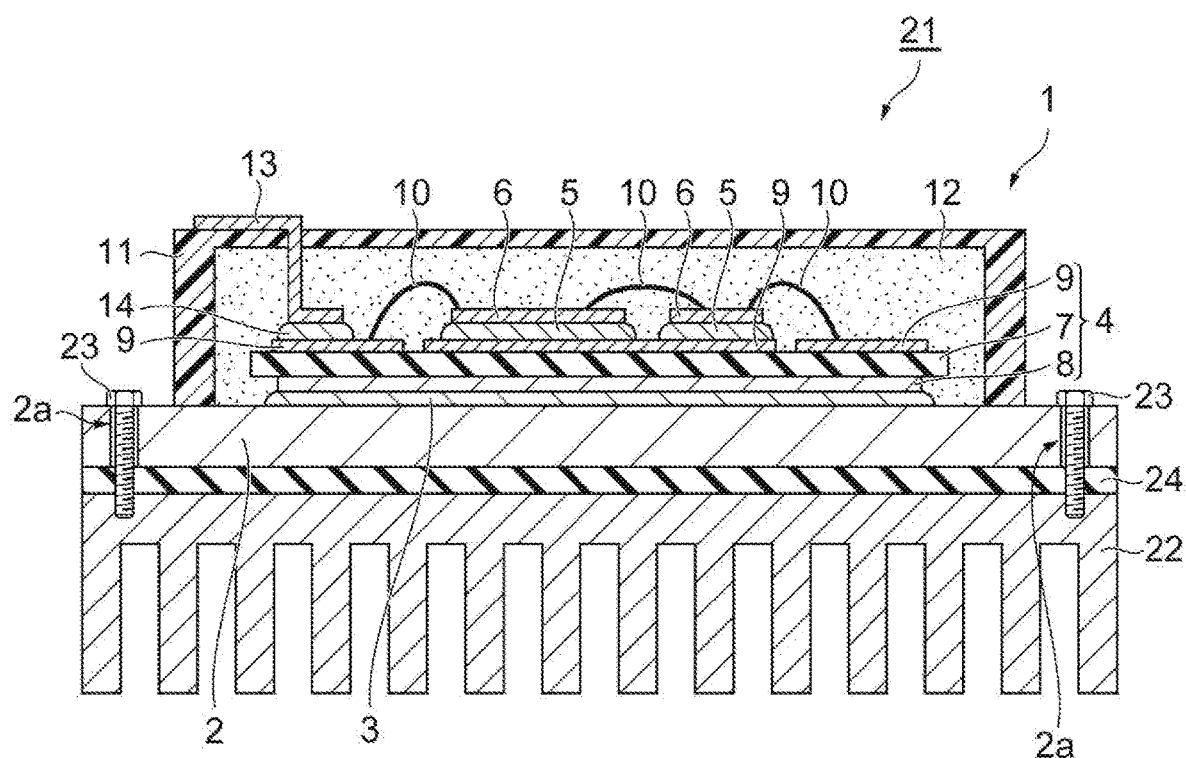
FIG. 2 is a cross-sectional view illustrating one embodiment of a power module having a heat radiation component attached thereto.

Here, the case of attaching the heat radiation component to the power module 1 is described. FIG. 2 is a cross-sectional view illustrating one embodiment of a power module having a heat radiation component attached thereto (for convenience, also referred to as "heat radiation component attached power module"). As illustrated in FIG. 2, a heat radiation component attached power module 21 includes the aforementioned power module 1, and a heat radiation component 22 such as a heat radiation fin attached to the power module 1 on the base plate 2 side. The heat radiation component 22 is screwed to the power module 1 (base plate 2) by a screw (bolt) 23 inserted into the attachment hole 2a formed on the base plate 2. The surface of the heat radiation component 22 on the power module 1 side has an approximately planar shape.

Between the base plate 2 of the power module 1 and the heat radiation component 22, a grease (heat radiation grease) 24 is disposed to make sure that the both are in close contact. The grease 24 usually has a heat transfer rate of about 1 to 2 W/mK, and this is the largest heat resistance in the component members of the heat radiation component attached power module 21. That is to say, in order to enhance the heat radiation property of the power module 1, it is important to minimize the heat resistance of this grease 24.

For this purpose, it is effective to use a heat radiation grease with high heat transfer rate as the grease 24 and to reduce the layer thickness of this grease 24. However, if the layer thickness of the grease 24 is extremely thin, the grease 24 cannot follow the deformation due to thermal burden in the operation of the power module 1, for example, and an air layer may be generated between the power module 1 and the heat radiation component 22. As a result, the heat radiating characteristic of the power module 1 may deteriorate drastically and the semiconductor element 6 may be damaged, for example. Ideally, the grease 24 is a uniformly thin film, and in order to form the uniformly thin film, the shape of a surface (heat radiation surface) 2b of the base plate 2 on the side opposite to the ceramic insulating substrate 4 in the power module 1 is important.

Specifically, when the power module 1 and the heat radiation component 22 such as a heat radiation fin are screwed, it is preferable that the flatness of the heat radiation surface of the power module 1 is low. As the flatness is higher, the thickness of the grease 24 becomes thicker partially and the heat resistance of the grease 24 increases; thus, the sufficient heat radiating characteristic is not obtained. Thus, in the power module 1, the flatness of the surface (heat radiation surface) 2b of the base plate 2 on the side opposite to the ceramic insulating substrate 4 when the heat radiation component 22 is attached is preferably 30 μm or less and more preferably 20 μm or less. When the flatness is 30 μm or less, as described above, the grease 24 can easily have the uniform thin film shape, and the sufficient heat radiating characteristic can be obtained in the power module 1.

Note that the flatness described above means the flatness measured in accordance with JIS B0621. More specifically, the flatness can be calculated by, in a state where the heat radiation component 22 with a hole or the similar resin member is attached to the base plate 2, measuring the shape using a contact displacement meter from the hole, or calculated by, in a state where the heat radiation component 22 that is transparent or the similar resin member is attached to the base plate 2, measuring the shape using a noncontact displacement meter. In these cases, as the heat radiation component 22 or the similar resin member to be attached, the one with a flatness of 0 to 5 μm on the surface on the base plate 2 side is used. The flatness is measured in a state where the heat radiation component 22 or the similar resin member is screwed to the base plate 2 with a torque of 10 N using at least four screws (bolts).

In order for the flatness of the surface (heat radiation surface) 2b of the base plate 2 on the side opposite to the ceramic insulating substrate 4 in the power module 1 with the heat radiation component 22 attached thereto to be within the above range, in the power module 1, as illustrated in FIG. 1, the surface 2b of the base plate 2 on the side opposite to the ceramic insulating substrate 4 has a warp 2c with a convex shape (convex type) in the state where the heat radiation component 22 is not attached. Since the heat radiation surface 2b of the base plate 2 has the warp 2c with the convex shape, when screwed to the heat radiation component 22 or the like, the stress is sufficiently applied also to a central part of the base plate 2. The size of the warp 2c (warp amount) of the heat radiation surface 2b of the base plate 2, which corresponds to the size of warp W per a length L of 10 cm in the heat radiation surface 2b direction at an arbitrary position on the base plate 2, is preferably 50 μm or less and more preferably 30 μm or less. When the warp amount is 50 μm or less, it is possible to prevent the deformation amount from becoming too large when the power module 1 is screwed to the heat radiation component 22, and the problem of the damage of the ceramic base material 7 in the ceramic insulating substrate 4 can be reduced.

The shape (warp amount) of the heat radiation surface 2b of the base plate 2 in the power module 1 is determined mainly depending on the initial shape (warp amount) of the base plate 2 itself and the amount of deformation (warp change amount) when the ceramic insulating substrate 4 is bonded to the base plate 2 with the first solder 3 (note that, strictly, a little affected by the stress generated when the housing 11 is attached to the base plate 2).

Regarding the initial shape of the base plate 2 itself, the warp amount before the base plate 2 is bonded to the ceramic insulating substrate 4, which corresponds to the size of the warp per a length of 10 cm in the heat radiation surface 2b direction of the base plate 2, is preferably 30 to 100 μm and more preferably 30 to 50 μm.

The warp change amount when the ceramic insulating substrate 4 is bonded to the base plate 2 with the first solder 3 is, as the warp change amount per a length of 10 cm in the heat radiation surface 2b direction of the base plate 2, preferably 20 μm or less, more preferably 10 μm or less, and much more preferably 5 μm or less from the viewpoints of reducing the stress on the first solder 3 and making it easier to control the shape of the heat radiation surface 2b of the base plate 2 in the power module 1. The warp change amount is defined as an absolute value of the difference between the warp amount of the base plate 2 before the base plate 2 is bonded to the ceramic insulating substrate 4 and the warp amount of the base plate 2 after the base plate 2 is bonded to the ceramic insulating substrate 4.

In order to obtain the characteristic about the warp as above, the heat radiation surface 2b of the base plate 2 may be formed by, after being formed into a flat-plate shape, machining or grinding, or processing with the use of a die with a desired shape.

Here, the deformation caused when the ceramic insulating substrate 4 is bonded to the base plate 2 occurs due to the stress generated because of the thermal expansion difference between the base plate 2 and the ceramic insulating substrate 4 when the bonding temperature (temperature at which the first solder 3 is solidified) is returned to room temperature. In order to reduce the amount of deformation (warp change amount) at this time, usually, it is effective to use the ceramic insulating substrate 4 with a low linear thermal expansion coefficient and the base substrate 2 with the similar linear thermal expansion coefficient.

Specifically, it is preferable that a linear thermal expansion coefficient α1 (×10$^{-6}$/K) of the base plate 2 when the temperature decreases from 150° C. to 25° C. and a linear thermal expansion coefficient α2 (×10$^{-6}$/K) of the ceramic insulating substrate 4 when the temperature decreases from 150° C. to 25° C. satisfy the following Expression (1):

$$\frac{|\alpha 1 - \alpha 2|}{(\alpha 1 + \alpha 2)/2} \times 100 \leq 10 \tag{1}$$

Thus, by reducing the difference in linear thermal expansion coefficient between the base plate 2 and the ceramic insulating substrate 4 when the temperature decreases from 150° C. to 25° C. to be within 10%, the warp change amount when the ceramic insulating substrate 4 is bonded to the base plate 2 can be suppressed and the shape (warp amount) of the heat radiation surface 2b of the base plate 2 in the power module 1 can be controlled to be within the desired range. The difference in linear thermal expansion coefficient in this case corresponds to the ratio of the difference in linear thermal expansion coefficient between the base plate 2 and the ceramic insulating substrate 4 (the numerator in the left side of Expression (1)) to the arithmetic mean of the linear thermal expansion coefficients of the base plate 2 and the ceramic insulating substrate 4 (the denominator of the left side of Expression (1)) as shown in Expression (1). Note that in Expression (1), the difference in thermal expansion between the base plate 2 and the ceramic insulating substrate 4 in a cooling process after the bonding with the first solder 3 is important; therefore, the value obtained when the temperature decreases from 150° C. to 25° C. is used as the linear thermal expansion coefficients α1 and α2. The linear thermal expansion coefficients α1 and α2 mean the linear thermal expansion coefficients that are measured by the thermal dilatometer (for example, TMA300 manufactured by Seiko Instruments Inc.) under the condition of a temperature decreasing speed of 5 GC/min or less in accordance with JIS R1618. The left side of Expression (1) is preferably 9(%) or less and more preferably 5(%) or less.

It is preferable that the base plate 2 as above with the linear thermal expansion coefficient (low linear thermal expansion coefficient) close to that of the ceramic insulating substrate is formed of a metal matrix composite including a metal mainly containing Al or Mg (for example, 85 mass % or more) and at least one selected from the group consisting of SiC, $Si_3N_4$, $Al_2O_3$, $SiO_2$, and AlN, an alloy containing Cu and Mo or Cu and W (Cu/Mo or Cu/W alloy), or a multilayer metal plate formed of Cu and Mo or Cu and W (Cu/Mo or Cu/W multilayer metal plate).

The linear thermal expansion coefficient $\alpha 1$ of the base plate 2 as above when the temperature decreases from 150° C. to 25° C. is preferably 5 to 9 ($\times 10^{-6}$/K) and more preferably 5 to 8 ($\times 10^{-6}$/K), from the viewpoint of suppressing the deformation at the bonding to the ceramic insulating substrate 4.

The heat transfer rate of the base plate 2 is preferably 150 W/mK or more and more preferably 200 W/mK or more. The heat transfer rate means the heat transfer rate measured by a laser flash method (for example, using LF/TCM-8510B manufactured by Rigaku Corporation) in accordance with JIS R1611.

The Young's modulus of the base plate 2 is preferably 100 to 400 GPa and more preferably 200 to 350 GPa. The Young's modulus means the Young's modulus measured by the three point bending method (for example, using autograph AG-X manufactured by SHIMADZU CORPORATION) in accordance with JIS R1602.

The flatness of the base plate 2 is preferably 30 μm or less, more preferably 20 μm or less, and much more preferably 10 μm or less. The flatness of the base plate 2 means the flatness measured in accordance with JIS B0621.

The linear thermal expansion coefficient $\alpha 2$ of the ceramic insulating substrate 4 is determined depending on the structure and the physical property value of the ceramic base material 7 and the metal layers 8 and 9, and moreover on the residual stress generated in the ceramic base material 7 due to the difference in thermal expansion from the metal layers 8 and 9 when the temperature is returned from the temperature in bonding the metal layers 8 and 9 to the ceramic base material 7 to the room temperature. Therefore, for example, even if the ceramic insulating substrate 4 with the same structure is used, the linear thermal expansion coefficient is different depending on the bonding method. In general, the metal layers 8 and 9 are often provided to the ceramic base material 7 by brazing at the high temperature of about 800° C. by an active metal brazing method; in this case, in the process of cooling to the room temperature, the tensile stress remains in the metal layers 8 and 9 where the linear thermal expansion coefficient is high. As a result, the linear thermal expansion coefficient $\alpha 2$ of the obtained ceramic insulating substrate 4 is lower than the linear thermal expansion coefficient calculated based on the physical property value of the ceramic base material 7 and the metal layers 8 and 9.

On the other hand, in order to decrease the linear thermal expansion coefficient $\alpha 1$ of the base plate 2 as described above, in the case of using the metal matrix composite, it is necessary to increase the ratio of the ceramics with the low linear thermal expansion coefficient. In this case, there are problems that the manufacture becomes difficult and the cost increases. In the case of using the alloy of Cu/Mo, Cu/W, or the like or the multilayer metal plate, if it is desired to decrease the linear thermal expansion coefficient, the ratio of Mo or W with the low heat transfer rate needs to be increased. In this case, there are problems that the heat transfer rate is decreased, the material cost increases, and the material itself becomes heavy because the density is increased. From these perspectives, it is effective to increase the linear thermal expansion coefficient $\alpha 2$ of the ceramic insulating substrate 4.

As a technique of increasing the linear thermal expansion coefficient $\alpha 2$ of the ceramic insulating substrate 4, it is effective to increase the thickness of the metal layers 8 and 9 with the high linear thermal expansion coefficient and to reduce the residual stress in the metal layers 8 and 9 by decreasing the temperature in bonding the ceramic base material 7 and the metal layers 8 and 9. If the thickness of the metal layers 8 and 9 is increased, the linear thermal expansion coefficient $\alpha 2$ of the ceramic insulating substrate 4 becomes high; however, the tensile stress for the ceramic base material 7 becomes large and in a heat cycle test performed in view of the practical application, a problem may occur in terms of reliability, for example, a crack may be caused in the ceramic base material 7. On the other hand, as a technique of decreasing the temperature in bonding the ceramic base material 7 and the metal layers 8 and 9, a technique of attaching them at low temperature using the adhesive is employed. By this technique, the linear thermal expansion coefficient $\alpha 2$ of the ceramic insulating substrate 4 can be increased but the adhesive layer with extremely low heat transfer rate exists and therefore, a problem may occur in the heat radiation property as the power module 1. Therefore, a technique in which after the thin metal layer is formed by the active metal brazing method or the like on the surface of the ceramic base material 7, the metal with predetermined thickness is bonded at low temperature or a technique in which the metal layer is formed by a cold spray method is effective.

The linear thermal expansion coefficient $\alpha 2$ of the ceramic insulating substrate 4 as above is preferably 5 to 9 ($\times 10^{-6}$/K and more preferably 5 to 8 ($\times 10^{-6}$/K). The heat transfer rate of the ceramic base material 7 is preferably 30 W/mK or more, more preferably 80 W/mK or more, and much more preferably 150 W/mK or more from the viewpoint of making the ceramic insulating substrate 4 have the excellent thermal conductivity. In order to obtain the ceramic insulating substrate 4 as above, for example, the ceramic base material 7 is formed of AlN, $Si_3N_4$, or $Al_2O_3$, and the metal layers 8 and 9 are formed of at least one selected from the group consisting of Cu, Al, Mo, an alloy containing Cu and Mo, and an alloy containing Cu and W.

Since the shape of the heat radiation surface 2b of the base plate 2 is controlled as appropriate and the heat radiating characteristic is excellent, the power module 1 described above is also suitable for the power module including, in addition to Si, a SIC or GaN semiconductor element capable of increasing the output. That is to say, the semiconductor element 6 may be formed of any one of Si, SiC, and GaN. Thus, the size reduction and energy saving of the power module can be achieved efficiently. In addition, the power module 1 is suitably used as a driving inverter of a train or an automobile that is required to have the high withstanding voltage, the high output, and the like.

EXAMPLES

Hereinafter, the present invention is described in more detail with reference to Examples. However, the present invention is not limited to these Examples.

<Base Plate>

In Examples and Comparative examples, base plates 1 to 12 shown in Table 1 were used. Each base plate was obtained by processing a commercial material into a predetermined shape by a grinding process and then plating the material through electroless Ni plating. In order to measure each physical property value in Table, a heat transfer rate measuring test body (diameter 11 mm×thickness 3 mm), a linear thermal expansion coefficient measuring test body (diameter 3 mm×length 10 mm), and an elastic modulus measuring test body (3 mm×4 mm×length 40 mm) were manufactured by the grinding process. With the use of each test piece, the heat transfer rate at 25° C. was measured by a laser flash method (LF/TCM-8510B manufactured by Rigaku Corporation), the linear thermal expansion coefficient when the temperature decreases from 150° C. to 25° C. was measured by the thermal dilatometer (TMA300 manufactured by Seiko Instruments Inc.), and the Young's modulus was measured by the three point bending method (autograph AG-X manufactured by SHIMADZU CORPORATION). In addition, the warp amount of the heat radiation surface was measured using a three-dimensional contour profile measuring machine (CONTOURECORD 1600D-22 manufactured by TOKYO SEIMITSU CO., LTD.). In addition, the flatness was measured by screwing the test piece to a transparent resin block with a torque of 10 N and then measuring the shape of the heat radiation surface with the use of a laser displacement meter (LT9010M manufactured by Keyence).

In the insulating substrate 6 (five-layer structure), metal circuits 8a and 9a were formed in accordance with a technique similar to that for the insulating substrates 1 to 5, and then copper circuits 8b and 9b were stacked thereon by a spray method (cold spray method), an annealing process was performed at 300° C., and after that, electroless Ni plating was performed.

In the insulating substrate 7 (five-layer structure), a metal circuit was formed in accordance with a technique similar to that for the insulating substrates 1 to 5 and the circuit metal was bonded thereto with the high-temperature solder with a melting point of 300° C., and then, electroless Ni plating was performed.

In the insulating substrate 8 (three-layer structure), an Al—Cu clad foil was used as the brazing material and the circuit metal was bonded to the ceramic base material 7 at 630° C., and then, an etching method was performed to form the metal circuit and electroless Ni plating was performed.

In the insulating substrate 9 (five-layer structure), a metal circuit was formed in accordance with a technique similar to that for the insulating substrate 8, and then a copper circuit was stacked thereon by a spray method (cold spray method), an annealing process was performed at 300° C., and after that, electroless Ni plating was performed.

In the insulating substrate 10 (three-layer structure), an aluminum circuit was stacked by a spray method (cold spray method), an annealing process was performed at 500° C., and after that, electroless Ni plating was performed.

In the insulating substrate 11 (five-layer structure), an aluminum circuit was stacked by a spray method (cold spray method), an annealing process was performed at 500° C., and after that, a copper circuit was stacked thereon by a spray method (cold spray method) and an annealing process was performed at 300° C., and then, electroless Ni plating was performed.

In the insulating substrate 12 (three-layer structure), circuit metal was attached to each surface of the ceramics with

TABLE 1

| Base plate No. | Size (mm) | Material | Heat transfer rate (W/mK) | Linear thermal expansion coefficient (×10⁻⁶/K) | Young's modulus (GPa) | Warp amount (μm) | Flatness (μm) |
|---|---|---|---|---|---|---|---|
| 1 | 140 × 190 × 5 | Al—SiC (80%) | 250 | 5.0 | 300 | 25 | 10 |
| 2 | 140 × 190 × 5 | Al—SiC (65%) | 220 | 7.0 | 220 | 5 | 10 |
| 3 | | | | | | 25 | 10 |
| 4 | | | | | | 50 | 10 |
| 5 | | | | | | 25 | 0 |
| 6 | | | | | | 25 | 50 |
| 7 | 140 × 190 × 5 | Al—SiC (50%) | 200 | 9.0 | 200 | 25 | 10 |
| 8 | 140 × 190 × 5 | Mg—SiC (65%) | 230 | 7.5 | 140 | 25 | 10 |
| 9 | 140 × 190 × 5 | Cu—Mo (PCM30) | 200 | 7.3 | 230 | 25 | 10 |
| 10 | 140 × 190 × 5 | Cu—W (W15) | 190 | 7.2 | 310 | 25 | 10 |
| 11 | 140 × 190 × 5 | Kovar | 17 | 5.3 | 140 | 25 | 10 |
| 12 | 130 × 140 × 5 | Al—SiC (65%) | 220 | 7.0 | 220 | 25 | 10 |

<Ceramic Insulating Substrate>

Figure 3:
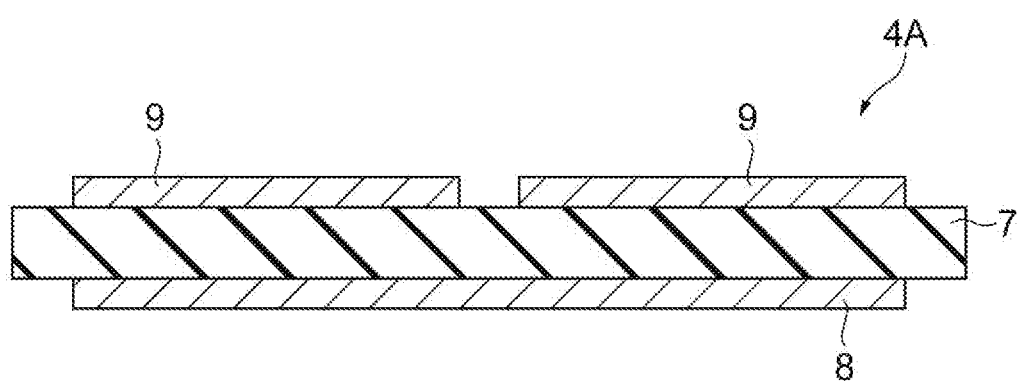
Figure 3:
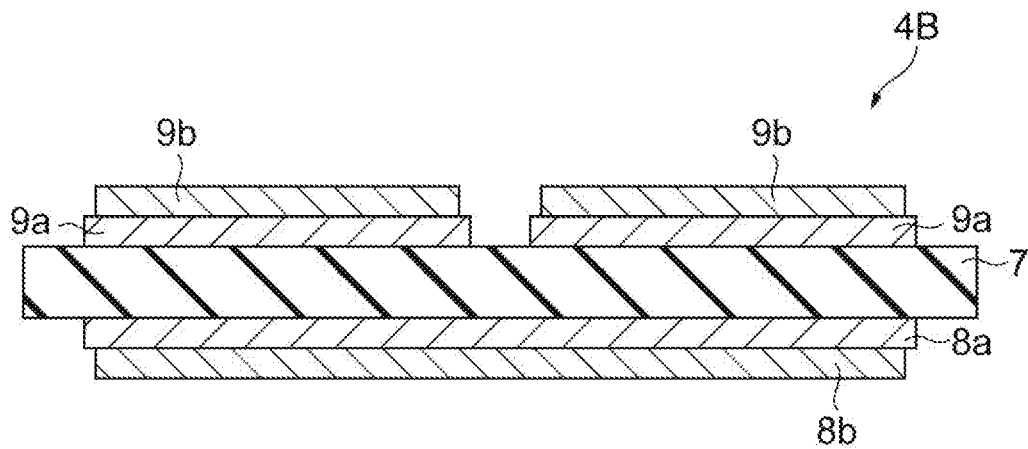

In Examples and Comparative examples, insulating substrates 1 to 13 each corresponding to a ceramic insulating substrate 4A with a three-layer structure illustrated in FIG. 3(a) or a ceramic insulating substrate 4B with a five-layer structure illustrated in FIG. 3(b) were used. The details of each insulating substrate are described below and shown in Table 2.

In the insulating substrates 1 to 5 (three-layer structure), a brazing material of Ag (90%)-Cu (10%)-TiH$_2$ (3.5%) was used and a metal was bonded to the ceramic base material 7 at 800° C., and then, an etching method was performed to form a metal circuit and electroless Ni plating was performed.

an acrylic adhesive, and after that, an etching method was performed to form a metal circuit and electroless Ni plating was performed.

As the insulating substrate 13 (three-layer structure), a commercial ceramic insulating substrate (manufactured by MARUWA) manufactured by a DBC (Direct Bonded Copper) method was used.

The heat transfer rate of each insulating substrate was measured by manufacturing the heat transfer rate measuring test body (diameter 11 mm×plate thickness) from the ceramic base material. The linear thermal expansion coefficient when the temperature decreases from 150° C. to 25° C. was measured by manufacturing the linear thermal expansion coefficient measuring test body (3 mm×plate thickness× length 10 mm) from the ceramic insulating substrate.

TABLE 2

| Insulating substrate No. | Size (mm) | Ceramic base material 7 Quality of material | Thickness (mm) | Metal layers 8, 9 (8a, 9a) Quality of material | Thickness (mm) | Metal layers 8b, 9b Quality of material | Thickness (mm) |
|---|---|---|---|---|---|---|---|
| 1 | 50 × 60 | AlN | 0.635 | Cu | 0.3 | — | — |
| 2 | | AlN | 1.0 | Cu | 0.3 | — | — |
| 3 | | $Si_3N_4$ | 0.635 | Cu | 0.3 | — | — |
| 4 | | $Si_3N_4$ | 0.32 | Cu | 0.3 | — | — |
| 5 | | $Si_3N_4$ | 0.32 | Cu | 1.0 | — | — |
| 6 | | $Si_3N_4$ | 0.32 | Cu | 0.1 | Cu | 0.9 |
| 7 | | $Si_3N_4$ | 0.635 | Cu | 0.1 | Cu | 0.9 |
| 8 | | AlN | 0.635 | Al | 0.4 | — | — |
| 9 | | AlN | 0.635 | Al | 0.2 | Cu | 0.4 |
| 10 | | AlN | 0.635 | Al | 0.4 | — | — |
| 11 | | AlN | 0.635 | Al | 0.2 | Cu | 0.4 |
| 12 | | AlN | 0.635 | Cu | 0.3 | — | — |
| 13 | | $Al_2O_3$ | 0.635 | Cu | 0.3 | — | — |

| Insulating substrate No. | Bonding technique (circuit formation) | Bonding temperature (° C.) | Heat transfer rate (W/mK) | Linear thermal expansion coefficient (×10$^{-6}$/K) |
|---|---|---|---|---|
| 1 | Active metal brazing method | 800° C. | 180 | 5.1 |
| 2 | Active metal brazing method | 800° C. | 180 | 5.0 |
| 3 | Active metal brazing method | 800° C. | 90 | 3.4 |
| 4 | Active metal brazing method | 800° C. | 90 | 4.5 |
| 5 | Active metal brazing method | 800° C. | 90 | 6.9 |
| 6 | Active metal brazing method/spray method | 800° C./300° C. | 90 | 8.2 |
| 7 | Active metal brazing method/soldering | 800° C./300° C. | 90 | 9.0 |
| 8 | Active metal brazing method | 630° C. | 180 | 5.2 |
| 9 | Active metal brazing method/spray method | 630° C./300° C. | 180 | 6.7 |
| 10 | Spray method | 300° C. | 180 | 6.0 |
| 11 | Spray method/spray method | 300° C./300° C. | 180 | 6.9 |
| 12 | Attaching method | 25° C. | 180 | 6.8 |
| 13 | DBC method | 1050° C. | 30 | 8.5 |

Example 1

The insulating substrate 11 in Table 2 was used as the ceramic insulating substrate and after a Si semiconductor element and an electrode were bonded to the insulating substrate 11 with a high-temperature solder, the base plate 3 in Table 1 was further bonded to the insulating substrate 11 using a eutectic solder. Next, after an Al line was bonded and wired with ultrasonic waves to the Si semiconductor element and the ceramic insulating substrate, the resin housing was attached to the base plate with an adhesive, and then, the resin housing was filled with silicone gel; thus, the power module was manufactured. As a result of measuring the shape of the heat radiation surface of the obtained power module with the use of a three-dimensional contour profile measuring device, the warp amount per a length of 10 cm was 26 μm.

Next, this power module was fastened to a transparent resin block with a size of 140 mm×190 mm×50 mm with eight M6 attachment bolts, and fixed thereto with a torque of 10 N. After that, the flatness of the base plate on the heat radiation surface of the power module was measured from the back surface of the resin block using the laser displacement meter, and the result was 11 μm. The obtained power module was subjected to the heat cycle test for 1000 cycles, one cycle including a test at −40° C.×30 minutes and a test at 125° C.×30 minutes, and then, the electric characteristic was evaluated; the results indicate that the initial characteristic was maintained.

Examples 2 to 16, Comparative Examples 1 to 8

The power module was manufactured by a technique similar to that of Example 1 except that the insulating substrate and the base plate shown in Table 3 were used. The evaluation result of the obtained power module is shown in Table 3. Note that if the sign of the warp amount or the warp change amount is minus, it means that the heat radiation surface had the warp with the concave shape or the shape of the warp has changed to the direction of becoming concave.

TABLE 3

|  | Base plate No. | Insulating substrate No. | Value of Expression (1) (%) | Warp amount (μm) | Warp change amount (μm) | Flatness (μm) |
|---|---|---|---|---|---|---|
| Example 1 | 3 | 11 | 1.4 | +26 | +1 | 11 |
| Example 2 | 1 | 1 | 2.0 | +26 | +1 | 11 |
| Example 3 | 1 | 2 | 0.0 | +25 | 0 | 11 |
| Example 4 | 1 | 8 | 3.9 | +24 | −1 | 11 |
| Example 5 | 2 | 11 | 1.4 | +5 | 0 | 10 |
| Example 6 | 4 | 11 | 1.4 | +49 | −1 | 11 |
| Example 7 | 5 | 11 | 1.4 | +26 | +1 | 1 |
| Example 8 | 3 | 5 | 1.4 | +26 | +1 | 11 |
| Example 9 | 7 | 7 | 0 | +25 | 0 | 10 |
| Example 10 | 8 | 11 | 8.3 | +20 | −5 | 13 |
| Example 11 | 9 | 11 | 5.6 | +22 | −3 | 12 |
| Example 12 | 10 | 11 | 4.3 | +23 | −2 | 11 |
| Example 13 | 8 | 6 | 8.9 | +29 | +4 | 14 |
| Example 14 | 3 | 9 | 4.4 | +23 | −2 | 12 |
| Example 15 | 7 | 13 | 5.7 | +20 | −5 | 14 |
| Example 16 | 12 | 11 | 1.4 | +26 | +1 | 11 |
| Comparative example 1 | 3 | 1 | 31.4 | −10 | −35 | 29 |
| Comparative example 2 | 3 | 2 | 33.3 | −12 | −37 | 32 |
| Comparative example 3 | 1 | 3 | 38.1 | −15 | −40 | 36 |
| Comparative example 4 | 3 | 4 | 43.5 | −25 | −50 | 45 |
| Comparative example 5 | 3 | 6 | 15.8 | +46 | 21 | 25 |
| Comparative example 6 | 3 | 8 | 29.5 | −8 | −33 | 28 |
| Comparative example 7 | 3 | 10 | 15.4 | +3 | −22 | 21 |
| Comparative example 8 | 6 | 11 | 1.4 | 25 | 0 | 51 |

Example 17

The power module was manufactured by a technique similar to that of Example 1 except that a SiC semiconductor element was used as the semiconductor element. The shape of the heat radiation surface of the obtained power module was measured using the three-dimensional contour profile measuring device, and the result indicates that the warp amount per a length of 10 cm was 24 Next, this power module was fastened to a transparent resin block with a size of 140 mm×190 mm×50 mm with eight M6 attachment bolts, and attached thereto with a torque of 10 N. After that, the flatness of the base plate on the heat radiation surface of the power module was measured from the back surface of the resin block using the laser displacement meter, and the result was 10 μm. The obtained power module was subjected to the heat cycle test for 1000 cycles, one cycle including a test at −40° C.×30 minutes and a test at 175° C.×30 minutes, and then, the electric characteristic was evaluated; the results indicate that the initial characteristic was maintained. This result indicates that the obtained power module is suitably usable as the driving inverter for trains or automobiles required to have the high withstanding voltage, high output, and the like.

REFERENCE SIGNS LIST

1 Power module
2 Base plate
2a Surface of base plate on side opposite to ceramic insulating substrate (heat radiation surface)
2c Warp of heat radiation surface of base plate
4 Ceramic insulating substrate
6 Semiconductor element
7 Ceramic base material
8 First metal layer
9 Second metal layer

The invention claimed is:

1. A power module comprising:
   a base plate;
   a ceramic insulating substrate bonded on the base plate; and
   a semiconductor element bonded on the ceramic insulating substrate, wherein
   a surface of the base plate on a side opposite to the ceramic insulating substrate has a warp with a convex shape, and
   a linear thermal expansion coefficient α1 (×10⁻⁶/K) of the base plate and a linear thermal expansion coefficient α2 (×10⁻⁶/K) of the ceramic insulating substrate when a temperature decreases from 150° C. to 25° C. satisfy the following Expression (1).

$$\frac{|\alpha 1 - \alpha 2|}{(\alpha 1 + \alpha 2)/2} \times 100 \leq 10 \qquad (1)$$

2. The power module according to claim 1, wherein a difference between a size of the warp of the base plate bonded to the ceramic insulating substrate and the size of the warp of the base plate before being bonded to the ceramic insulating substrate is 20 μm or less per a length of 10 cm.

3. The power module according to claim 1, wherein the ceramic insulating substrate comprises a ceramic base material and metal layers provided to both surfaces of the ceramic base material,
   the ceramic base material is formed of AlN, $Si_3N_4$, or $Al_2O_3$,
   the metal layers are formed of at least one selected from the group consisting of Cu, Al, Mo, an alloy comprising Cu and Mo, and an alloy comprising Cu and W, and
   the linear thermal expansion coefficient α2 of the ceramic insulating substrate is 5 to 9 (×10⁻⁶/K).

4. The power module according to claim 1, wherein the base plate comprises
- a metal matrix composite comprising a metal comprising Al or Mg and at least one selected from the group consisting of SiC, $Si_3N_4$, $Al_2O_3$, $SiO_2$, and AlN,
- an alloy comprising Cu and Mo or Cu and W, or
- a multilayer metal plate formed of Cu and Mo or Cu and W, and the linear thermal expansion coefficient $\alpha1$ of the base plate is 5 to 9 ($\times 10^{-6}$/K) and a heat transfer rate of the base plate is 150 W/mK or more.

5. The power module according to claim 1, wherein the surface of the base plate on the side opposite to the ceramic insulating substrate is machined or ground.

6. The power module according to claim 1, wherein a flatness of the surface of the base plate on the side opposite to the ceramic insulating substrate when a heat radiation component is attached to the surface is 30 μm or less.

7. The power module according to claim 1, wherein the semiconductor element is formed of any one of Si, SiC, or GaN.

8. The power module according to claim 1, the power module being used as a driving inverter for a train or an automobile.

* * * * *